(12) United States Patent
Gu

(10) Patent No.: US 6,535,399 B2
(45) Date of Patent: Mar. 18, 2003

(54) TRACKING POWER SUPPLY CONTROLLING

(75) Inventor: Wenjian Gu, Hopkinton, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 09/929,757

(22) Filed: Aug. 14, 2001

(65) Prior Publication Data

US 2003/0035304 A1 Feb. 20, 2003

(51) Int. Cl.[7] .................... H02M 3/335; H03F 1/30
(52) U.S. Cl. .......................... 363/17; 330/297
(58) Field of Search ............... 363/17, 16, 20, 363/98, 97, 95, 56; 330/263, 146, 279, 297

(56) References Cited

U.S. PATENT DOCUMENTS

| | | | |
|---|---|---|---|
| 4,054,843 A | | 10/1977 | Hamada ............... 330/263 |
| 4,218,660 A | | 8/1980 | Carver ................. 330/297 |
| 4,323,959 A | * | 4/1982 | Check .................. 363/40 |
| 4,329,657 A | | 5/1982 | Kamiya ................ 330/297 |
| 4,472,687 A | | 9/1984 | Kashiwagi et al. ... 330/297 |
| 4,484,150 A | | 11/1984 | Carver ................. 330/297 |
| 4,498,057 A | | 2/1985 | Noro ................... 330/297 |
| 4,507,619 A | | 3/1985 | Dijkstra et al. ....... 330/297 |
| 4,518,928 A | | 5/1985 | Ishii ................... 330/297 |
| 4,520,322 A | | 5/1985 | Ishii ................... 330/263 |
| 4,586,002 A | | 4/1986 | Carver ................. 330/297 |
| 4,631,652 A | * | 12/1986 | Wendt .................. 363/16 |
| 4,670,832 A | * | 6/1987 | Park ..................... 363/98 |
| 4,672,528 A | * | 6/1987 | Park et al. ............ 363/98 |
| 4,692,851 A | | 9/1987 | Attwood ............... 363/16 |
| 4,729,085 A | * | 3/1988 | Truskalo ............... 363/56 |
| 4,808,946 A | | 2/1989 | Carver et al. ........ 330/297 |
| 4,930,063 A | * | 5/1990 | Henze et al. ......... 363/91 |
| 4,992,751 A | * | 2/1991 | Attwood et al. ...... 330/10 |
| 5,014,016 A | * | 5/1991 | Anderson ............. 330/251 |
| 5,345,165 A | | 9/1994 | Froeschle ............. 323/284 |
| 5,510,753 A | | 4/1996 | French ................. 330/146 |
| 5,554,959 A | | 9/1996 | Tang ................... 330/297 |
| 5,777,519 A | | 7/1998 | Simopoulos .......... 330/297 |

OTHER PUBLICATIONS

Carver, Bob, Sunfire's Load Invariant Stereo Power Amplifier User's Manual, No date available.
Feldman, Len, "Class G High Efficiency HI–FI Amplifier," Radio–Electronics, Aug. 1976, pp. 47–49, 87.

* cited by examiner

Primary Examiner—Rajnikant B. Patel
(74) Attorney, Agent, or Firm—Fish & Richardson P.C.

(57) ABSTRACT

The output voltage of the output of a power supply for providing power to an audio amplification and transduction system having a plurality of channels with each channel transmitting an audio signal includes monitoring the amplitude of the audio signals and providing a highest amplitude signal representative of the contemporary highest amplitude of the audio. AC electrical power has a variable frequency controlled by the highest amplitude signal and is converted to DC voltage having the output voltage related to the variable frequency. This DC voltage is delivered to the channels.

5 Claims, 4 Drawing Sheets

TRACKING POWER SUPPLY CONTROLLING

CROSS-REFERENCE TO RELATED APPLICATIONS

Not applicable to this invention.

STATEMENT REGARDING FEDERALLY SPONSORED RESEARCH OR DEVELOPMENT

This invention is not related to any federally sponsored research or development.

TECHNICAL FIELD

This invention relates to tracking power supplies, and more particularly to frequency modulated power supplies for multiple track audio applications.

BACKGROUND OF THE INVENTION

It is an important object of the invention to provide an improved power supply for multiple track audio applications.

BRIEF SUMMARY OF THE INVENTION

According to the invention, a power supply for converting line AC electrical power to varying voltage DC electrical power to power audio amplification and transduction circuitry, the audio amplification and transduction circuit having a plurality of input channels, each channel including an audio signal having an amplitude, includes a connector, for connecting the power supply to a source of line AC power. The power supply further includes a first converter device, electrically coupled to the connector, for converting the line AC power to DC power and a switching circuit, electrically coupled to the first converter device, for converting the DC power from the first converter device to AC power. The switching circuit is controllable so that the AC power from the switching device has a variable frequency. A power converter circuit, electrically coupled to the first converter device, has an input voltage and an output voltage, wherein a ratio of the input voltage to the output voltage is responsive to the variable frequency. A tracking device tracks the amplitudes of the plurality of channels as a function of time. The power supply further includes a device for determining the highest absolute value of the amplitudes of the plurality of input channels as a function of time and a frequency modulator for controlling the switching circuit to control the ratio of input voltage to output voltage so that the power supply provides sufficient power to amplify the audio signal in the track corresponding to the highest absolute value of the amplitudes.

In another aspect of the invention, a method for controlling the output voltage of the output of a power supply for providing power to an audio amplification and transduction system having a plurality of channels, each of the channels transmitting an audio signal having an amplitude, includes the steps of monitoring the amplitudes of the audio signals in the plurality of channels as a function of time; determining, as a function of time, the maximum of the amplitudes; obtaining AC line electrical power; converting the electrical power to DC electrical power; converting the DC electrical power to AC electrical power having a variable frequency, wherein the variable frequency is responsive to the maximum of the amplitudes; converting the AC electrical power to AC electrical power having a variable voltage in a manner such that the reduced voltage is responsive to the variable frequency; and converting the variable voltage AC power to DC electrical power having a corresponding variable voltage.

Other features, objects, and advantages will become apparent from the following detailed description, which refers to the following drawing in which:

DETAILED DESCRIPTION OF THE INVENTION

Figure 1:
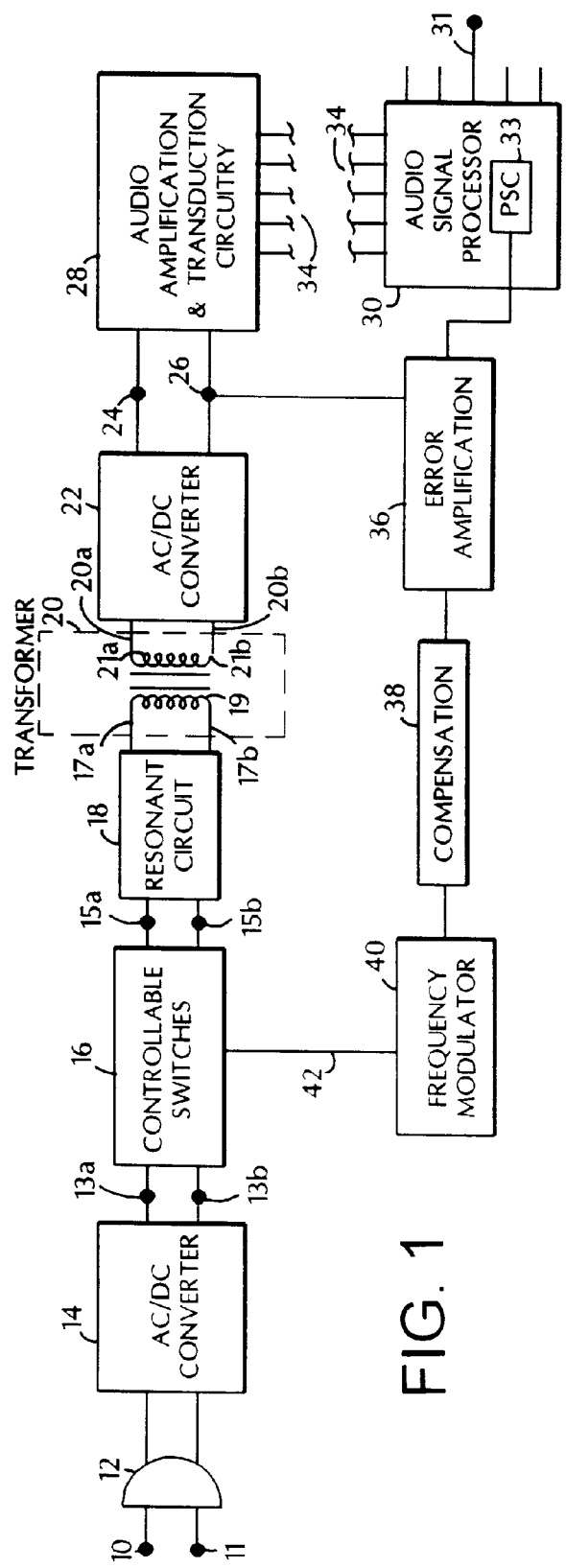
FIG. 1 is a block diagram of a multichannel audio device incorporating the invention.

With reference now to the drawing and more particularly to FIG. 1, there is shown a block diagram of a power supply according to the invention. Terminals 10, 11 of connector 12 connect to AC line source (not shown). Connector 12 is in turn electrically coupled to first AC/DC converter 14. First AC/DC converter 14 is electrically coupled to controllable switches 16 by power lines 13a, 13b. Controllable switches 16 are coupled to resonant circuit 18 by power lines 15a, 15b. Resonant circuit 18 is electrically coupled to primary winding 19 of transformer 20 by power lines 17a, 17b. Secondary windings 21a and 21b of transformer 20 are coupled to second AC/DC converter 22 by power lines 20a, 20b. Second AC/DC converter 22 is coupled to rails 24, 26. Rails 24, 26 may be connected to audio amplification and transduction circuitry 28. Audio signal processor 30 is connected by a signal line 31 to a source of audio signals. If the audio signals are digitally encoded, signal line 31 is typically a single line. If the audio signals are analog, signal line 31 typically includes a separate line for each audio channel. Power supply control (PSC) module 33 of audio signal processor 30 is coupled by signal lines to error amplification device 36; error amplification device is also coupled to rail 26 as shown or to rail 24. Error amplification device 36 is further coupled by signal lines to compensation device 38 and to frequency modulator 40. Frequency modulator 40 is coupled to controllable switches by signal line 42.

In operation, connector 12 plus into an AC outlet to provide line voltage to AC/DC converter 14. AC/DC converter converts the line AC voltage to a DC voltage so that the voltage across power lines 13a, 13b is DC at the peak line voltage or at twice the peak line voltage if AC/DC converter include a voltage doubler rectifier. Controllable switches 16 switch at a high frequency so that the voltage across power lines 15a, 15b has a square or trapezoidal waveform at a frequency of >20 kHz. Electrical power is then conducted through resonant circuit 18 to transformer 20 so that voltage across power lines 20a and 20b has a square or trapezoidal waveform at substantially the same frequency as the frequency across power lines 17a, 17b at a voltage $V_o$. Second AC/DC converter 22 converts the square or trapezoidal waveform to two unidirectional voltages so that the voltage at output terminal 24 is $+V_o$ and the voltage at output terminal 26 is $-V_o$.

PSC module 33 determines the highest absolute value of the amplitudes of the signals in the audio input channels at each point in time. Error amplification device 36 compares the signals from PSC module 33 with the voltage from rail 26 to develop an error signal, amplifies the error signal and transmits the amplified error signal to compensation device 38. Compensation device 38 adjusts the gain and phase of the amplified error signal, and transmits the adjusted error signal to frequency modulator 40. Frequency modulator 40 determines an appropriate switching frequency for controllable switches: 16, and transmits that frequency over signal line 42 to controllable switches 16.

The resonant circuit 18 between the controllable switches 16 and the transformer shapes the current to a quasi-sinusoidal waveform. A current having a quasi-sinusoidal waveform has very low harmonic content. A power supply according to the invention is advantageous because the high electromagnetic interference (EMI) emissions that are associated with conventional power supplies using pulse modulation or pulse width modulation are reduced. The power supply can be conveniently placed in an audio system chassis near radio receiving circuitry with relatively little EMI shielding.

Figure 2:
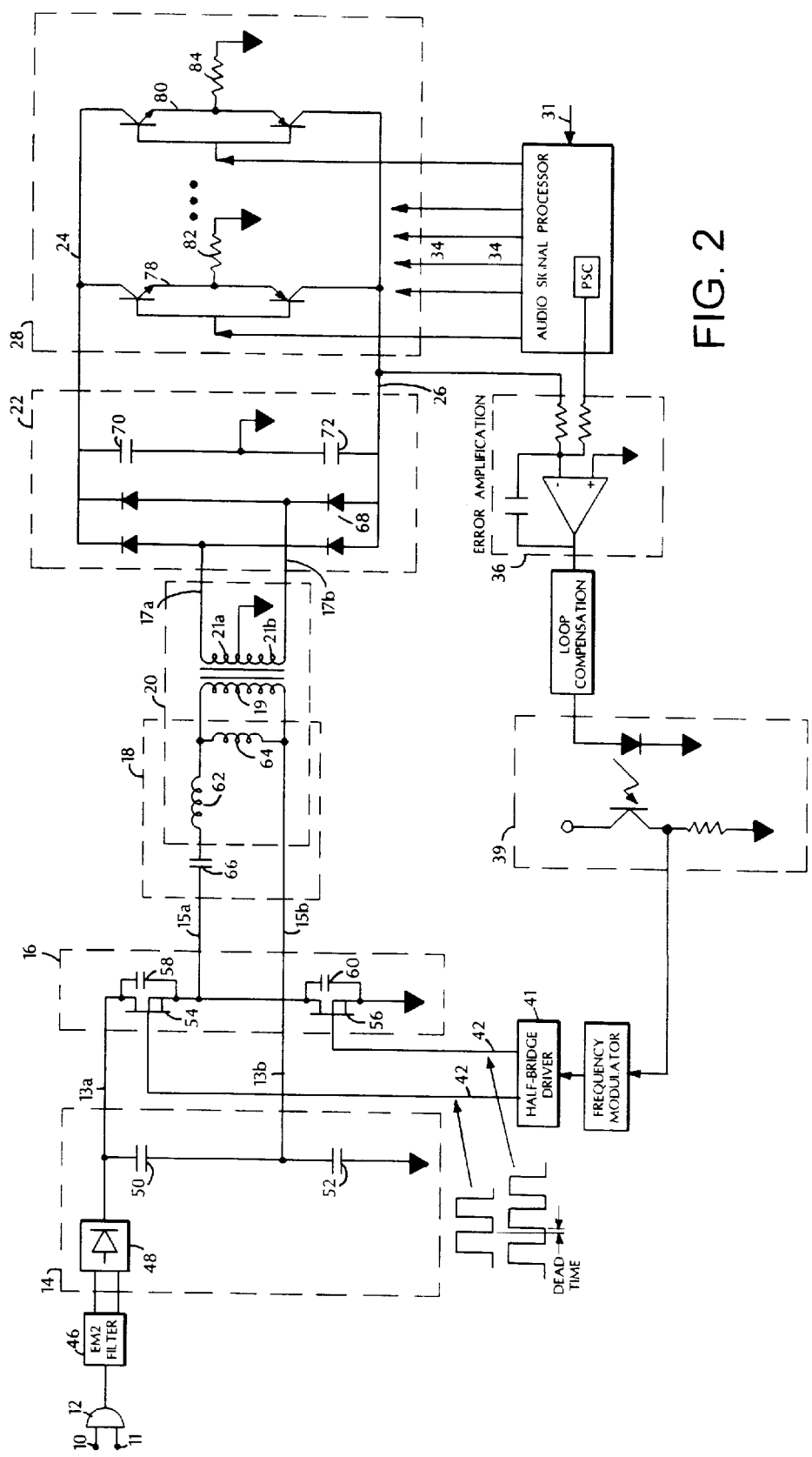
FIG. 2 is a more detailed block diagram of the multichannel audio device of FIG. 1.

Referring now to FIG. 2, there is shown the power supply of FIG. 1, showing the circuitry that performs the functions of some of the blocks of FIG. 1 and also shows some elements that are useful in a practical embodiment of the invention. In FIG. 2, like reference numerals refer to like elements in the several views of the drawings. The grouping of the elements of FIG. 2 is according to the logical arrangement of the elements as shown in FIG. 1. The elements of FIG. 1 do not necessarily represent distinct physical elements and the elements of FIG. 2 may be physically grouped differently than they are grouped in FIGS. 1 and 2. EMI filter 46 is not shown in FIG. 1. Its purpose is to prevent EMI emissions generated by the current switches from flowing to the line source. First AC/DC converter 14 may include a bridge rectifier 48 and two capacitors 50 and 52. First AC/DC converter 14 may include a full bridge rectifier with a capacitor, having an output voltage of at peak line voltage. Alternatively, first AC/DC converter may include a voltage doubler, having a voltage output of twice the line peak voltage. Controllable switches may include two semiconductor switches 54, 56 which alternately turn on and off at a high frequency (>20 kHz, in one implementation between 100 kHz and 200 kHz) with a duty ratio of slightly less than 50% to invert the DC input voltage to high frequency square wave voltage. The duty ratio of slightly less than 50% allows a small dead time during which both switches are turned off. The dead time avoids "shoot through" of the switches and allows zero-voltage switching as will be explained later. Resonant circuit 18 has two inductors 62, 64, and a capacitor 66. Capacitor 66 and inductor 62 are arranged in a conventional series resonant manner. The parameters of inductor 62, and capacitor 66 are selected such that the resonant frequency of the inductor 62 and the capacitor 66 is lower than the range of switching frequencies. Capacitors 58, 60 of controllable switches 16, connected in parallel with the switches, slow down the voltage transition across the two switches, changing the square wave waveform to a trapezoidal waveform, further reducing the EMI emissions that result from the switching. The dead time for the two switches 54, 56 should be chosen so that it allows the transition of the voltage across the two switches (from high to zero or from zero to high) to be completed within the dead time. With an adequate dead time, the two switches are turned on and off at zero voltage, which reduces switching losses. A dead time of approximately 300 ns is adequate for a switching frequency of 100 kHz to 200 kHz. Transformer 20 may be a conventional step-down transformer with center tap windings at its secondary. In an exemplary embodiment, transformer 20 is a step-down transformer that has a leakage inductance for inductor 62 and a magnetizing inductance for inductor 64. Its two secondary windings 21a and 21b are tightly coupled. Second AC/DC converter 22 may include a bridge rectifier 68 and two capacitors 70, 72. Audio amplification and transduction circuitry 28 may include rails 24, 26, audio power amplifiers 78, 80, and electroacoustical transducers, represented by load resistors 82, 84. Audio signal processor 30 and PSC module 33 may be conventional digital and analog devices, or, in a specific embodiment, may be digital signal processors running appropriate software on digital audio signals. In the case of digital audio signals, the multiple channels may be transmitted over a single signal line 31. Error amplification device 36, compensation device 38, opto-isolator 39, frequency modulator 40, and half-bridge driver 41 all include conventional circuit elements arranged in a conventional manner. In one embodiment, frequency modulator 40 and half-bridge driver 41 are implemented on a single monolithic circuit L6598 available commercially from ST Microelectronics of Carrollton, Tex. (website us.st.com).

A characteristic of a power supply according to the invention is that the ratio of the voltage at the output lines (the voltage at line 24 and the voltage at line 26) to the voltage at the input lines (across lines 15a and 15b) is determined by the relationship of the switching frequency at the input lines 24 and 26 to the resonant frequency of capacitor 66 and inductor 62.

Figure 3:
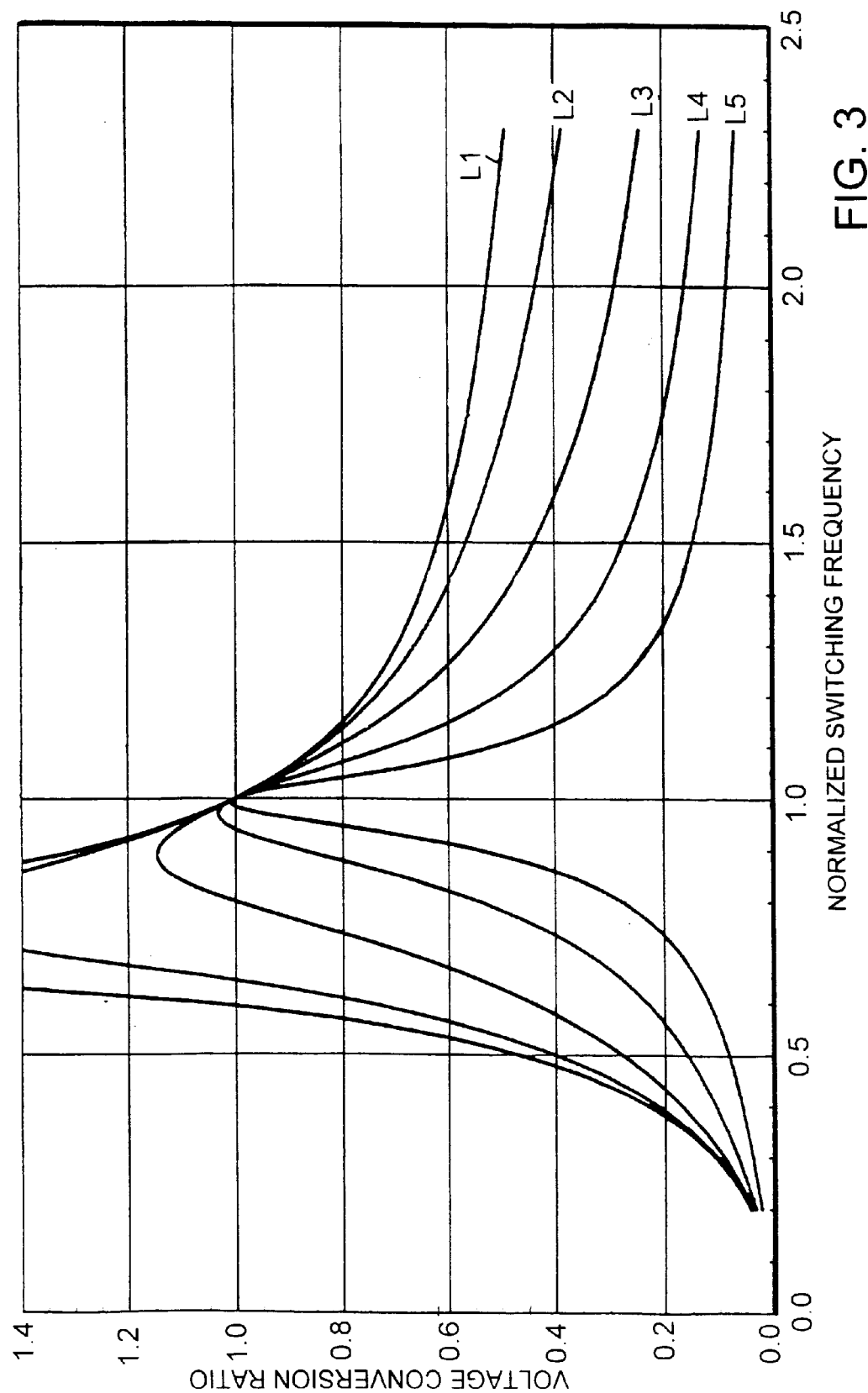
FIG. 3 is a plot of the voltage conversion ratio as a function of the normalized switching frequency for a resonant circuit according to the invention.

Referring to FIG. 3, there is shown a plot of voltage conversion ratio versus normalized switching frequency for a power supply according to FIGS. 1 and 2. Each of the curves represents a different load resistance seen at line 24 or at line 26. The normalized switching frequency is expressed as multiples of the resonant frequency, which is determined by the parameters of capacitor 66 and inductor 62 of resonant circuit 18. A typical resonant frequency is 100 kHz. So, for example with load L3, and a switching frequency of 1.5 times the resonant frequency, the voltage conversion ratio is about 0.45, so that with a line voltage of 120 volts rms, a peak voltage of 170 volts, and a turns ratio of primary windings 19 to secondary windings 21a or 21b of five, the voltage Vo is about (170×0.45)/5 or about 15.3 volts.

Figure 4:
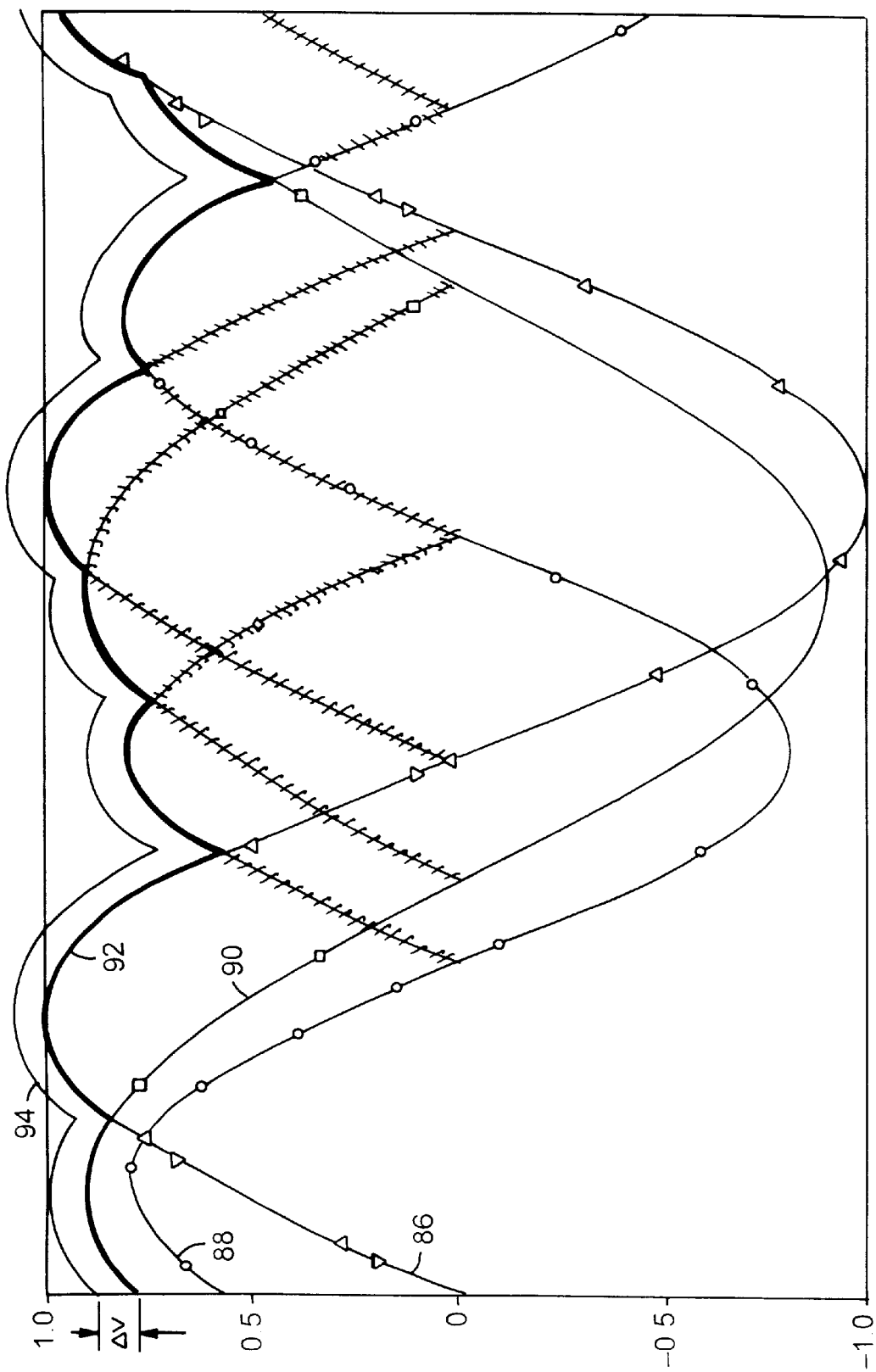
FIG. 4 is a plot illustrating the tracking of the audio signals.

Referring to FIG. 4, there is shown an example of the function of PSC module 33. Curves 86, 88, 90 represent the audio signals in channels 1, 2, and 3, respectively, of a three channel audio system. PSC module determines the highest absolute value of the amplitudes of the three signals. To represent the absolute values, the rectified values of each of the curves are shown in dashed lines. The highest absolute value is shown as heavy line 92. The feedback loop including error amplification device 36, compensation device 38, and frequency modulator 40 act to maintain a voltage at rail 24 and at rail 26 that matches curve 92. In another implementation, the PSC module 33 builds in a small offset DV, for example 3v, to provide headroom for the amplifier, resulting in offset line 94. In this implementation, the feedback loop including error amplification device 36, compensation device 38, and frequency modulator 40 act to maintain a voltage that matches curve 94.

It is evident that those skilled in the art may now make numerous modifications of and departures from the specific apparatus and techniques disclosed herein without departing from the inventive concepts. Consequently, the invention is to be construed as embracing each and every novel feature and novel combination of features present in or possessed by the apparatus and techniques disclosed herein.

What is claimed is:

1. A power supply for providing voltage DC electrical power to power audio amplification and transduction circuitry, said audio amplification and transduction circuitry having a plurality of input channels, each channel including an audio signal having an amplitude, said power supply comprising, a source of DC electrical power, a switching circuit electrically coupled to said source of DC electrical power constructed and arranged for converting said DC power from said source of DC electrical power to controllable AC power, said switching circuit being controllable so that said controllable AC power from said switching device has a variable frequency, a power converter circuit electrically coupled to said source of DC electrical power responsive to said variable frequency for providing an output voltage related to said variable frequency, a device constructed and arranged to provide a highest amplitude signal representative of the contemporary amplitude of the audio signal then having the highest amplitude, and a frequency modulator for controlling said variable frequency so that said power supply provides sufficient power to amplify said audio signal with the highest contemporary amplitude.

2. A power supply in accordance with claim 1, wherein said power converter circuit comprises a resonant circuit having a resonant frequency whereby said output voltage is related to a ratio of the contemporary variable frequency to said resonant frequency.

3. A method for controlling the output voltage of the output of a power supply for providing power to an audio amplification and transduction system having a plurality of channels, each of said channels transmitting an audio signal having an amplitude, comprising, monitoring the amplitudes of said audio signals in said plurality of channels, providing a highest amplitude signal representative of the contemporary highest amplitude of said audio signals, providing AC electrical power having a variable frequency controlled by said highest amplitude signal, converting AC electrical power having said variable frequency to DC voltage having said output voltage related to said variable frequency, and delivering said DC voltage to said channels.

4. A power supply in accordance with claim 1, said source of DC power comprising:

a connector, for connecting said power supply to a source of line AC power; and a converter device electrically coupled to said connector constructed and arranged for converting said line AC power to said DC power.

5. A power supply in accordance with claim 4, wherein said power converter circuit comprises a resonant circuit having a resonant frequency whereby said output voltage is related to a ratio of the contemporary variable frequency to said resonant frequency.

* * * * *